United States Patent
Chiu et al.

(10) Patent No.: US 10,157,994 B2
(45) Date of Patent: Dec. 18, 2018

(54) HIGH ELECTRON MOBILITY TRANSISTOR AND METHOD OF FORMING THE SAME

(71) Applicant: Taiwan Semiconductor Manufacturing Company, Ltd., Hsinchu (TW)

(72) Inventors: Han-Chin Chiu, Kaohsiung (TW); Chi-Ming Chen, Zhubei (TW); Chung-Yi Yu, Hsinchu (TW); Chia-Shiung Tsai, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/865,376

(22) Filed: Jan. 9, 2018

(65) Prior Publication Data

US 2018/0151692 A1    May 31, 2018

Related U.S. Application Data

(60) Continuation of application No. 15/176,016, filed on Jun. 7, 2016, now Pat. No. 9,876,093, which is a (Continued)

(51) Int. Cl.
*H01L 29/66*    (2006.01)
*H01L 29/423*    (2006.01)
(Continued)

(52) U.S. Cl.
CPC .... *H01L 29/66462* (2013.01); *H01L 21/0254* (2013.01); *H01L 21/02241* (2013.01);
(Continued)

(58) Field of Classification Search
CPC .................................................. H01L 29/7786
See application file for complete search history.

(56) References Cited

U.S. PATENT DOCUMENTS 8,912,571 B2    12/2014 Kanamura et al.
2009/0189187 A1    7/2009 Briere et al.
(Continued)

FOREIGN PATENT DOCUMENTS

CN    102569377 A    7/2012

OTHER PUBLICATIONS

Cai, Yong et al., "High-Performance Enhancement-Mode AlGaN/GaN HEMTs Using Fluoride-Based Plasma Treatment," IEEE Electron Device Letters, vol. 26, No. 7, Jul. 2005, 3 pages.
(Continued)

*Primary Examiner* — Sitaramarao S Yechuri
(74) *Attorney, Agent, or Firm* — Slater Matsil, LLP

(57) ABSTRACT

A semiconductor structure includes a first III-V compound layer. A second III-V compound layer is disposed on the first III-V compound layer and is different from the first III-V compound layer in composition. A dielectric passivation layer is disposed on the second III-V compound layer. A source feature and a drain feature are disposed on the second III-V compound layer, and extend through the dielectric passivation layer. A gate electrode is disposed over the second III-V compound layer between the source feature and the drain feature. The gate electrode has an exterior surface. An oxygen containing region is embedded at least in the second III-V compound layer under the gate electrode. A gate dielectric layer has a first portion and a second portion. The first portion is under the gate electrode and on the oxygen containing region. The second portion is on a portion of the exterior surface of the gate electrode.

20 Claims, 8 Drawing Sheets

Related U.S. Application Data division of application No. 13/730,500, filed on Dec. 28, 2012, now Pat. No. 9,373,689.

(51) Int. Cl.

| | |
|---|---|
| *H01L 29/778* | (2006.01) |
| *H01L 29/10* | (2006.01) |
| *H01L 29/20* | (2006.01) |
| *H01L 21/02* | (2006.01) |
| *H01L 21/28* | (2006.01) |
| *H01L 21/311* | (2006.01) |
| *H01L 21/3213* | (2006.01) |
| *H01L 29/08* | (2006.01) |
| *H01L 29/205* | (2006.01) |

(52) U.S. Cl.
CPC .. *H01L 21/28264* (2013.01); *H01L 21/31111* (2013.01); *H01L 21/32133* (2013.01); *H01L 29/0847* (2013.01); *H01L 29/1033* (2013.01); *H01L 29/2003* (2013.01); *H01L 29/205* (2013.01); *H01L 29/4236* (2013.01); *H01L 29/42364* (2013.01); *H01L 29/7786* (2013.01)

(56) References Cited

U.S. PATENT DOCUMENTS

| | | | |
|---|---|---|---|
| 2010/0012977 A1* | 1/2010 | Derluyn | H01L 29/2003 257/194 |
| 2010/0025730 A1* | 2/2010 | Heikman | H01L 29/402 257/194 |
| 2011/0012173 A1 | 1/2011 | Umeda et al. | |
| 2011/0193135 A1 | 8/2011 | Hagleitner et al. | |
| 2011/0272741 A1 | 11/2011 | Hwang | |
| 2011/0272743 A1 | 11/2011 | Hwang et al. | |
| 2011/0303952 A1 | 12/2011 | Hwang et al. | |
| 2012/0091508 A1 | 4/2012 | Aoki | |
| 2012/0138944 A1 | 6/2012 | Kanamura et al. | |
| 2012/0205663 A1 | 8/2012 | Nakamura et al. | |
| 2012/0217545 A1 | 8/2012 | Kamada | |
| 2012/0267687 A1 | 10/2012 | Jeon et al. | |
| 2013/0320349 A1* | 12/2013 | Saunier | H01L 29/66462 257/76 |

OTHER PUBLICATIONS

Chen, Hongwei et al., "Enhancement-mode AlGaN/GaN HEMTs Fabricated by Standard Fluorine Ion Implantation," CS MANTECH Conference, May 17-20, 2010, Portland, Oregon, 4 pages.

Harada, Naohisa et al., "Formation of Recessed-Oxide Gate for Normally-Off AlGaN/GaN High Electron Mobility Transistors Using Selective Electrochemical Oxidation," Applied Physics Express 4 (2011) 021002, 2011 The Japan Society of Applied Physics, Feb. 4, 2011, 3 pages.

Imada, T. et al., "Enhancement-Mode GaN MIS-HEMTs for Power Supplies," The 2010 International Power Electronics Conference, IEEE, Jun. 21-24, 2010, pp. 1027-1033.

Medjdoub, F. et al., "Novel E-Mode GaN-on-Si MOSHEMT Using a Selective Thermal Oxidation," IEEE Electron Device Letters, vol. 31, No. 9, Sep. 2010, 3 pages.

\* cited by examiner

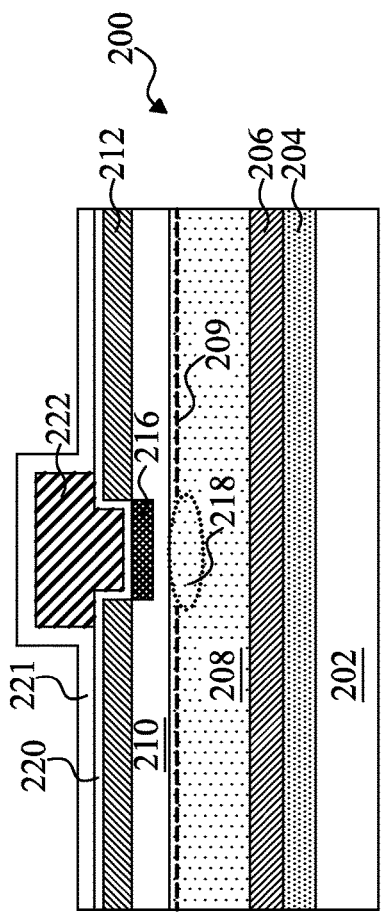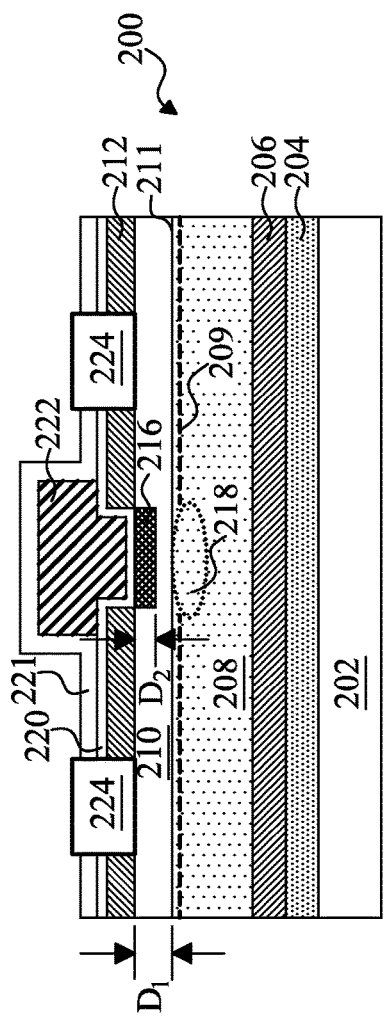

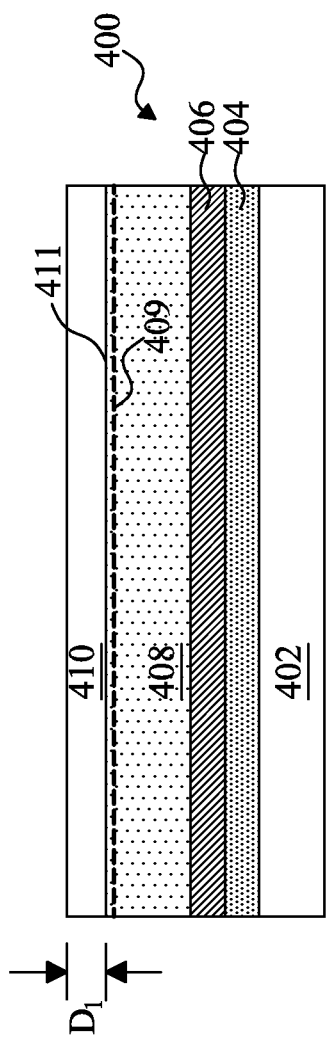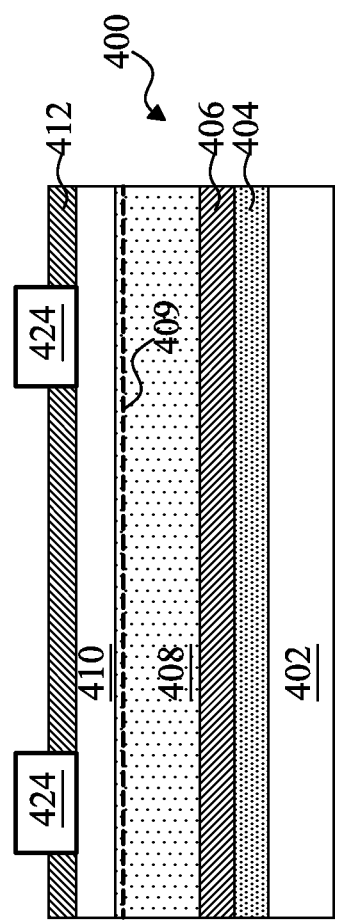
Fig. 4A
Fig. 4B

HIGH ELECTRON MOBILITY TRANSISTOR AND METHOD OF FORMING THE SAME

PRIORITY

This application claims the benefit of and is a continuation of U.S. patent application Ser. No. 15/176,016, filed on Jun. 7, 2016, and entitled "High Electron Mobility Transistor and Method of Forming the Same," which claims the benefit of and is a divisional of U.S. patent application Ser. No. 13/730,500, filed on Dec. 28, 2012, now U.S. Pat. No. 9,373,689 and entitled "High Electron Mobility Transistor and Method of Forming the Same," each application is incorporated herein by reference.

TECHNICAL FIELD

This disclosure relates generally to a semiconductor structure and, more particularly, to a high electron mobility transistor (HEMT) and method for forming a high electron mobility transistor.

BACKGROUND

In semiconductor technology, due to their characteristics, Group III-Group V (or III-V) semiconductor compounds are used to form various integrated circuit devices, such as high power field-effect transistors, high frequency transistors, or high electron mobility transistors (HEMTs). A HEMT is a field effect transistor incorporating a junction between two materials with different band gaps (i.e., a heterojunction) as the channel instead of a doped region, as is generally the case for metal oxide semiconductor field effect transistors (MOSFETs). In contrast with MOSFETs, HEMTs have a number of attractive properties including high electron mobility, the ability to transmit signals at high frequencies, etc.

From an application point of view, enhancement-mode (E-mode) HEMTs have many advantages. E-mode HEMTs allow elimination of negative-polarity voltage supply, and, therefore, reduction of the circuit complexity and cost. Despite the attractive properties noted above, a number of challenges exist in connection with developing III-V semiconductor compound-based devices. Various techniques directed at configurations and materials of these III-V semiconductor compounds have been implemented to try and further improve transistor device performance.

BRIEF DESCRIPTION OF THE DRAWINGS

Aspects of the present disclosure may be understood from the following detailed description and the accompanying figures. It is emphasized that, in accordance with the standard practice in the industry, various features are not drawn to scale. In fact, the dimensions of the various features may be arbitrarily increased or reduced for clarity of discussion.

FIGS. 2A to 2F are cross-sectional views of a semiconductor structure having a HEMT at various stages of manufacture according to one or more embodiments of the method of FIG. 1.

FIGS. 4A to 4F are cross-sectional views of a semiconductor structure having a HEMT at various stages of manufacture according to one or more embodiments of the method of FIG. 3.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

According to one or more embodiments of this disclosure, a semiconductor structure includes a high electron mobility transistor (HEMT). The HEMT includes a heterojunction formed between two different semiconductor material layers, such as material layers with different band gaps. In at least one embodiment, the HEMT includes a first III-V compound layer (also referred to as a channel layer) formed on a substrate and a second III-V compound layer (also referred to as a donor-supply layer) formed on the channel layer. The channel layer and the donor-supply layer are compounds made from the III-V groups in the periodic table of elements. However, the channel layer and the donor-supply layer are different from each other in composition. The first III-V compound layer is undoped or unintentionally doped (UID). The second III-V compound layer is intentionally doped.

The band gap discontinuity exists between the second III-V compound layer and the first III-V compound layer. The electrons from a piezoelectric effect in the second III-V compound layer drop into the first III-V compound layer, creating a very thin layer of highly mobile conducting electrons in the first III-V compound layer. This thin layer is referred to as a two-dimensional electron gas (2-DEG), forming a carrier channel. The carrier channel of 2-DEG is located at the first III-V compound layer near an interface of the second III-V compound layer and the first III-V compound layer. Thus, the carrier channel has high electron mobility because the first II-V compound layer is undoped or unintentionally doped, and the electrons can move freely without collision or with substantially reduced collisions with impurities.

According to one or more embodiments of this disclosure, a plurality of the semiconductor structures is formed within a chip region of the substrate. A plurality of semiconductor chip regions is marked on the substrate by scribe lines between the chip regions. The substrate will go through a variety of cleaning, layering, patterning, etching and doping steps to form the semiconductor structures. The term "substrate" herein generally refers to a bulk substrate on which various layers and device structures are formed. In some embodiments, the bulk substrate includes silicon, sapphire or silicon carbide. Examples of such layers include dielectric layers, doped layers, polysilicon layers or conductive layers. Examples of device structures include transistors, resistors, and/or capacitors, which may be interconnected through an interconnect layer to additional integrated circuits.

Figure 1:
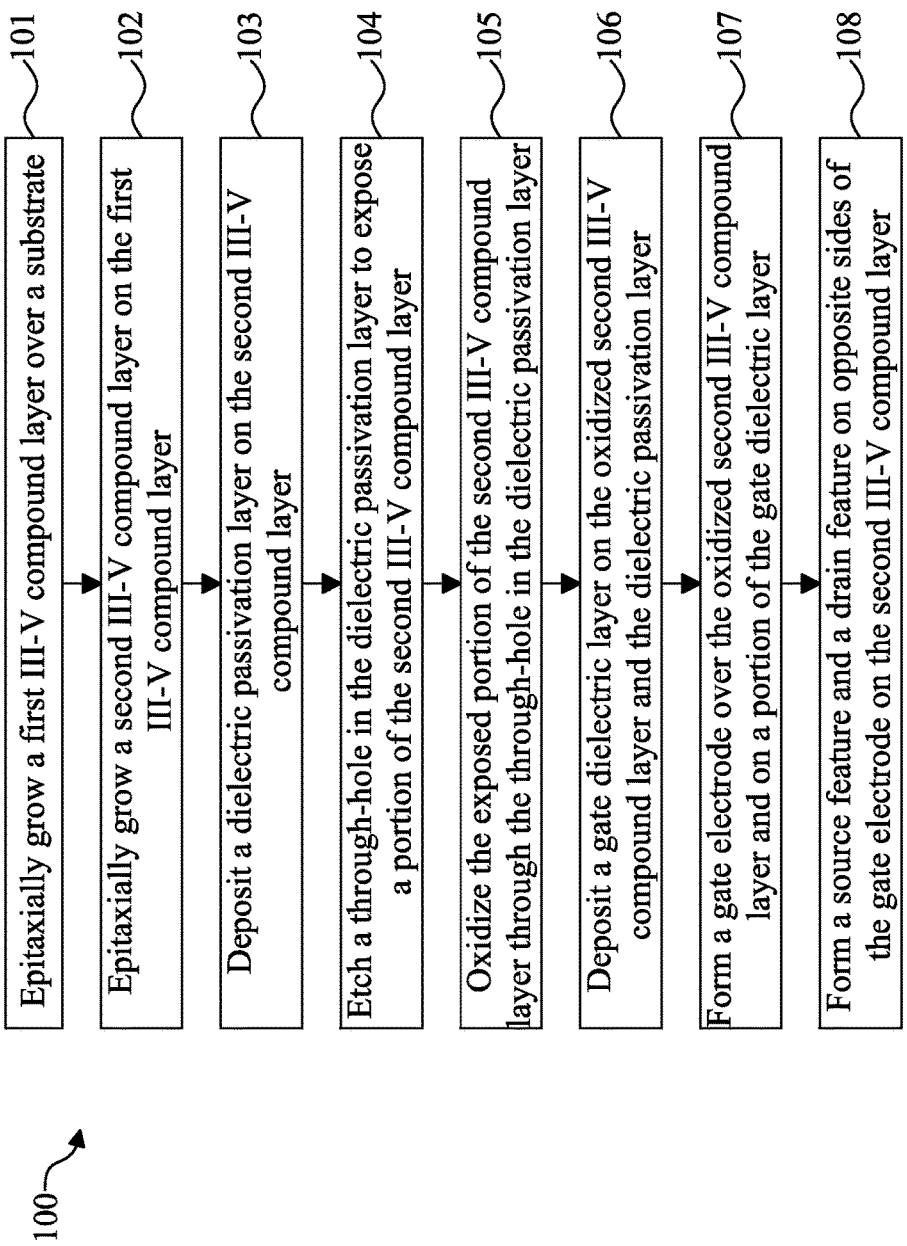
FIG. 1 is a flowchart of a method of forming a semiconductor structure having a HEMT according to at least one embodiment of this disclosure.

FIG. 1 is a flowchart of a method 100 of forming a semiconductor structure having a HEMT according to at least one embodiment of this disclosure. FIGS. 2A to 2F are cross-sectional views of a semiconductor structure 200 having a HEMT at various stages of manufacture according to various embodiments of the method 100 of FIG. 1. Additional processes may be provided before, during, or after the method 100 of FIG. 1. Various figures have been simplified for a better understanding of the inventive concepts of the present disclosure.

Referring now to FIG. 1, the flowchart of the method 100 begins with operation 101. A first III-V compound layer is epitaxially grown over a substrate. In at least one embodiment, the first III-V compound layer is formed on at least one buffer layer over the substrate. Next, the method 100 continues with operation 102 in which a second III-V compound layer is epitaxially grown on the first III-V compound layer. The second III-V compound layer is different from the first III-V compound layer in composition.

Figure 2A:
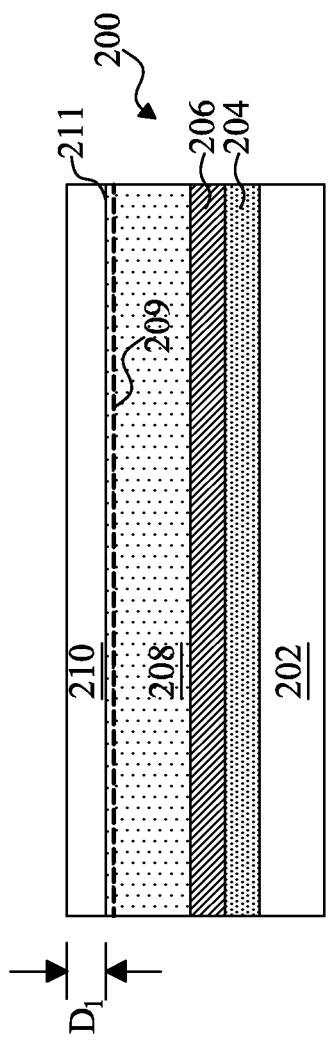

Referring to FIG. 2A, which is an enlarged cross-sectional view of a portion of a substrate 202 of a semiconductor structure 200 after performing operations 101 and 102. In some embodiments, the substrate 202 includes a silicon carbide (SiC) substrate, sapphire substrate or a silicon substrate. In the embodiments in FIGS. 2A-2F, the substrate 202 is referred to a silicon substrate.

At least one buffer layer is formed between the substrate 202 and the later formed first III-V compound layer 208. In the embodiment in FIG. 2A, buffer layers 204 and 206 are formed on the substrate 202 and function as an interface to reduce lattice mismatch between the substrate 202 and the later formed first III-V compound layer 208. In at least one embodiment, the buffer layer 204 includes an aluminum nitride (AlN) layer having a thickness in a range from about 10 nanometers (nm) to about 100 nm. In at least one embodiment, the buffer layer 206 includes an aluminum gallium nitride (AlGaN) layer having a thickness in a range from about 500 nm to about 1000 nm. The AlGaN layer 206 may be a "graded" buffer layer, which means that the relative amounts of the respective aluminum content will change with depth in the layer throughout the total thickness of the buffer layer 206. The relative amounts may change gradually to reduce the lattice parameter with distance from the substrate 202. The buffer layers (204 and 206) can be epitaxially grown by metal organic vapor phase epitaxy (MOVPE).

A first III-V compound layer 208, also referred to as a channel layer, is grown over the substrate 202 (on the buffer layer 206). In the embodiments of FIGS. 2A-2F, the first III-V compound layer 208 refers to a gallium nitride (GaN) layer (also referred to as the GaN layer 208). The GaN layer 208 can be epitaxially grown by metal organic vapor phase epitaxy (MOVPE) using gallium-containing precursor and nitrogen-containing precursor. The gallium-containing precursor includes trimethylgallium (TMG), triethylgallium (TEG), or other suitable chemical. The nitrogen-containing precursor includes ammonia ($NH_3$), tertiarybutylamine (TBAm), phenyl hydrazine, or other suitable chemical. The GaN layer 208 is undoped. Alternatively, the GaN layer 208 is unintentionally doped, such as lightly doped with n-type dopants due to a precursor used to form the GaN layer 208. In the embodiment of FIGS. 2A-2F, the GaN layer 208 has a thickness in a range from about 0.5 micron to about 10 microns. In other embodiments, the first III-V compound layer 208 may include a GaAs layer or InP layer.

A second III-V compound layer 210, also referred to as donor-supply layer, is grown on first III-V compound layer 208. An interface 211 is defined between the first III-V compound layer 208 and the second III-V compound layer 210. A carrier channel 209 of 2-DEG is located at the first III-V compound layer 208 near the interface 211. In at least one embodiment, the second III-V compound layer 210 refers to an aluminum gallium nitride (AlGaN) layer (also referred to as the AlGaN layer 210). In the embodiment of FIGS. 2A-2F, the AlGaN layer 210 is epitaxially grown on the GaN layer 208 by MOVPE using aluminum-containing precursor, gallium-containing precursor, and nitrogen-containing precursor. The aluminum-containing precursor includes trimethylaluminum (TMA), triethylaluminium (TEA), or other suitable chemical. The gallium-containing precursor includes TMG, TEG, or other suitable chemical. The nitrogen-containing precursor includes ammonia, TBAm, phenyl hydrazine, or other suitable chemical. In the embodiment of FIGS. 2A-2F, the AlGaN layer 210 has a thickness $D_1$ in a range from about 10 nm to about 50 nm. The AlGaN layer 210 is intentionally doped. In other embodiments, the second III-V compound layer 210 may include an AlGaAs layer, or AlInP layer.

Referring back to FIG. 1, method 100 continues with operations 103 and 104. In operation 103, a dielectric passivation layer is deposited on the second III-V compound layer. In operation 104, a through-hole is etched in the dielectric passivation layer to expose a portion of the second III-V compound layer.

Figure 2B:
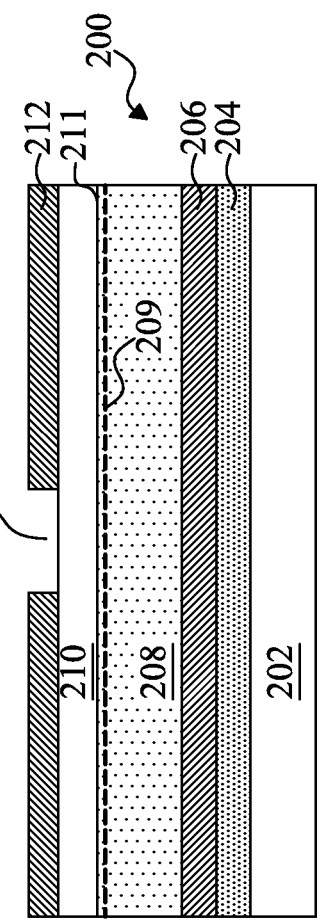

FIG. 2B illustrates a cross-sectional view of the semiconductor structure 200 after performing operations 103 and 104. A dielectric passivation layer 212 is deposited on a top surface of the second III-V compound layer 210. In the embodiment of FIGS. 2A-2F, the dielectric passivation layer 212 has a thickness in a range from about 100 Å to about 5000 Å. In some embodiments, the dielectric passivation layer 212 includes silicon oxide or silicon nitride. In at least one example, the dielectric passivation layer 212 is silicon nitride which is formed by performing a low pressure chemical vapor deposition (LPCVD) method without plasma using $SiH_4$ and $NH_3$ gases. The dielectric passivation layer 212 protects the underlying second III-V compound layer 210 from damage in the following processes having plasma environments.

Next, a through-hole 214 in the dielectric cap layer 212 is defined by lithography and etching processes to expose a portion of the top surface of the AlGaN layer 210. In some examples, the dielectric passivation layer 212 is silicon nitride and the through-hole 214 in silicon nitride is etched in a dry etching environment including $BCl_3$.

Referring back to FIG. 1, method 100 continues with operation 105. In operation 105, the exposed portion of the second III-V compound layer is oxidized through the through-hole in the dielectric passivation layer to form an oxygen containing region. In at least one embodiment, the oxidation is performed in ambient comprising ozone ($O_3$) in a temperature from about 250° C. to about 500° C. In certain embodiments, the oxidation is performed in ambient comprising $H_2O_2$, $H_2O$, $N_2O$ or NO.

Figure 2C:
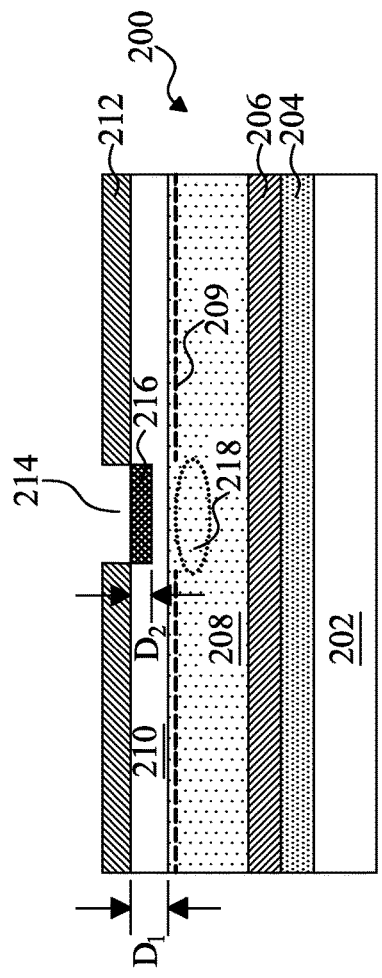

FIG. 2C illustrates a cross-sectional view of the semiconductor structure 200 after performing operation 105. An oxidation process is performed on the exposed portion of the second III-V compound layer 210 to form an oxygen containing region 216 through the through-hole 214. In at least one embodiment, the oxidation is performed in ambient comprising ozone ($O_3$) in a temperature from about 250° C. to about 500° C. Ozone may provide active atoms to convert the second III-V compound layer 210 into oxygen containing layer in a low operation temperature (less than 500° C.). The low operation temperature prevents the carrier channel 209 from damage during the oxidation. The electrical performances of the semiconductor structure 200 would not be affected. In certain embodiments, the oxidation is performed in ambient comprising $H_2O_2$, $H_2O$, $N_2O$ or NO. The oxygen containing region 216 comprises a compound including oxygen and at least one composition from the second III-V compound layer. In at least one example, the second III-V compound layer 210 is AlGaN layer and the compound of the oxygen containing region 216 includes $Al_2O_3$ and $Ga_2O_3$.

The oxidation consumes the exposed second III-V compound layer 210 (and converts it to the oxygen containing region 216) and generates a full depletion region 218 in the carrier channel 209. The carrier channel 209 becomes normally-off because of the depletion region 218. A positive gate voltage should be applied to turn on the carrier channel 209 of this HEMT. This HMET is also called an enhanced-mode HEMT.

In at least one embodiment, the oxygen containing region 216 is embedded in the second III-V compound layer 210 under the through-hole 214. In certain embodiments, the oxygen containing region 216 extends further into the first III-V compound layer 208 and is embedded in the second III-V compound layer 210 and a top portion of the first III-V compound layer 208. The oxygen containing region 216 has a thickness $D_2$ in a range from about 5 nm to about 50 nm. In some examples, a ratio of the thickness $D_2$ (of the oxygen containing region 216) to the thickness $D_1$ (of the second III-V compound layer 210) is in a range from about 0.5 to about 1.15. In certain examples, the ratio of the $D_2/D_1$ is in a range from about 0.8 to about 1.15. Out of these ranges, the oxygen containing region 216 may not effectively deplete the electrons in the depletion region 218 of the carrier channel 209, or the HEMT may suffer from low on-current issue.

Referring back to FIG. 1, method 100 continues with operation 106. In operation 106, a gate dielectric layer is deposited on the oxidized second III-V compound layer and the dielectric passivation layer. In certain embodiments, the steps of oxidizing the exposed portion of the second III-V compound layer in operation 105 and depositing the gate dielectric layer in operation 106 are performed in a same process chamber in different process steps.

Figure 2D:
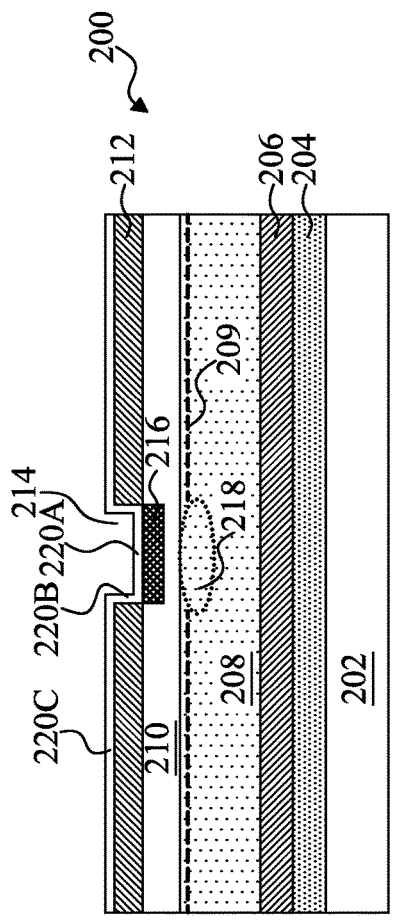

FIG. 2D illustrates a cross-sectional view of the semiconductor structure 200 after performing operation 106. A gate dielectric layer 220 is deposited over the semiconductor structure 200 shown in FIG. 2C. The gate dielectric layer 220 includes a first portion 220A, a second portion 220B and a third portion 220C. The first portion 220A is deposited on the oxidized second III-V compound layer 210 (also the oxygen containing region 216). The second portion 220B is deposited along an interior surface of the through-hole 214. The third portion 220C is deposited on the dielectric passivation layer 212. The gate dielectric layer 220 is formed between the oxygen containing region 216 and the later formed gate electrode. The gate dielectric layer 220 may increase the threshold voltage of this HEMT to a higher level and prevent a leakage current from the gate electrode to the second III-V compound layer 210. This HEMT could be operated a higher operation voltage for various applications.

In some embodiments, the gate dielectric layer 220 is in a thickness range from about 3 nm to about 50 nm. In some examples, the gate dielectric layer 220 comprises silicon oxide, silicon nitride, gallium oxide, aluminum oxide, scandium oxide, zirconium oxide, lanthanum oxide or hafnium oxide.

In at least one embodiment, the gate dielectric layer 220 is formed by an atomic layer deposition (ALD) method. The ALD method is based on the sequential use of a gas phase chemical process. The majority of ALD reactions use two chemicals, typically called precursors. These precursors react with a surface one-at-a-time in a sequential manner. By exposing the precursors to the growth surface repeatedly, the gate dielectric layer 220 is deposited. The ALD method provides a uniform thickness of the gate dielectric layer 220 with high quality. In one example, the gate dielectric layer 220 is zirconium oxide. In some embodiments, a first precursor includes tetrakis (ethylmethylamino) zirconium (TEMAZr) or zirconium chloride ($ZrCl_4$). In some embodiments, a second precursor includes oxygen in order to oxidize the first precursor material to form a monolayer. In some examples, the second precursor includes ozone ($O_3$), oxygen, water ($H_2O$), $N_2O$ or $H_2O$—$H_2O_2$. In other embodiments, the gate dielectric layer 220 is formed by a plasma enhanced chemical vapor deposition (PECVD) or a low pressure chemical vapor deposition (LPCVD).

In certain embodiments, the steps of forming the oxygen containing region 216 (step 105) and depositing the gate dielectric layer 220 (step 106) are performed in a same ALD process chamber in different process steps. The oxidation in operation 105 is performed in an ALD chamber with ambient comprising ozone ($O_3$) to convert the exposed second III-V compound layer 210 into oxygen containing region 216. Next, depositing the gate dielectric layer 220 in operation 106 is performed in the same ALD chamber with the ALD method as previous mentioned.

Referring back to FIG. 1, method 100 continues with operation 107. In operation 107, a gate electrode is formed over the oxidized second III-V compound layer and on a portion of the gate dielectric layer.

FIG. 2E illustrates a cross-sectional view of the semiconductor structure 200 after performing operation 107. A gate electrode 222 is formed over the oxygen containing region 216 on the first portion 220A of the gate dielectric layer 220. A portion of the gate electrode 222 is embedded in the dielectric passivation layer 212. The second portion 220B of the gate dielectric layer 220 is on a portion of an exterior surface of the gate electrode 222. The third portion 220C of the gate dielectric layer 220 is under a portion of the gate electrode 222 and over the dielectric passivation layer 212. In at least one example, a gate electrode layer is deposited on the gate dielectric layer 220, and overfills the through-hole 214 shown in FIG. 2D. Lithography and etching processes are performed on the gate electrode layer to define the gate electrode 222. In some embodiments, the gate electrode 222 includes a conductive material layer that includes a refractory metal or its compounds, e.g., titanium (Ti), titanium nitride (TiN), titanium tungsten (TiW) and tungsten (W). In another example, the gate electrode 222 includes nickel (Ni), gold (Au) or copper (Cu). In some embodiments, a dielectric cap layer 221 is formed gate electrode 222 and over dielectric passivation layer 212 to protect gate electrode 222 during subsequent operations.

Referring back to FIG. 1, method 100 continues with operation 108. In operation 108, a source feature and a drain feature are formed on opposite sides of the gate electrode on the second III-V compound layer.

FIG. 2F illustrates a cross-sectional view of the semiconductor structure 200 after performing operation 108. Two openings (not shown) on opposite sides of the gate electrode are defined by lithography and etching processes in both the gate dielectric layer 220 and the dielectric passivation layer 212 (and option dielectric cap layer 221) to expose portions of the second III-V compound layer 210.

A metal layer is deposited over the gate dielectric layer 220 (and the dielectric passivation layer 212), overfilling the openings and contacting the second III-V compound layer 210. A photoresist layer (not shown) is formed over the metal layer and developed to form a feature over the openings. The metal layer not covered by the feature of the photoresist layer is removed by a reactive ion etch (RIE)

process that etches the exposed portions of the metal layer down to the underlying the gate dielectric layer 220. Metal features 224 are generated after the etching process. The metal features 224 are configured as the source feature or the drain feature for the HEMT. The photoresist layer is removed after the formation of the metal features 224. The dielectric passivation layer 212 protects the underlying second III-V compound layer 210 from damage during the etching process to form metal features 224. The carriers in carrier channel 209 underlying the second III-V compound layer 210 would not be affected during the etching process. The electrical performances of the semiconductor structure 200 would be positively affected. Therefore, the yield of the overall assembly could increase.

In some embodiments, the metal layer of the metal features 224 includes one or more conductive materials. In at least one example, the metal layer is free of gold (Au) and comprises Ti, Co, Ni, W, Pt, Ta, Pd, Mo, TiN, or AlCu alloy. In another example, the metal layer includes a bottom Ti/TiN layer, an AlCu layer overlying the bottom Ti/TiN layer, and a top Ti layer overlying the AlCu layer. The formation methods of the metal layer include atomic layer deposition (ALD) or physical vapor deposition (PVD) processes. In at least one embodiment, a thermal annealing process may be applied to the metal features 224 such that the metal features, the second III-V compound layer 210 and the first III-V compound layer 208 react to form an intermetallic compound. The intermetallic compound of the source/drain feature 224 provides for more effective electrical connection to the carrier channel 209. Although Au could be used for forming the metal features 224, by not using Au in the metal features 224, the method 100 could also be implemented in the production line of integrated circuits on silicon substrate. The contamination concern from Au on the silicon fabrication process could be eliminated.

In the above described embodiments, the gate electrode 222, the source/drain features 224, and the carrier channel 209 are configured as a transistor. When a voltage is applied to the gate electrode 222, a device current of the transistor could be modulated.

Figure 3:
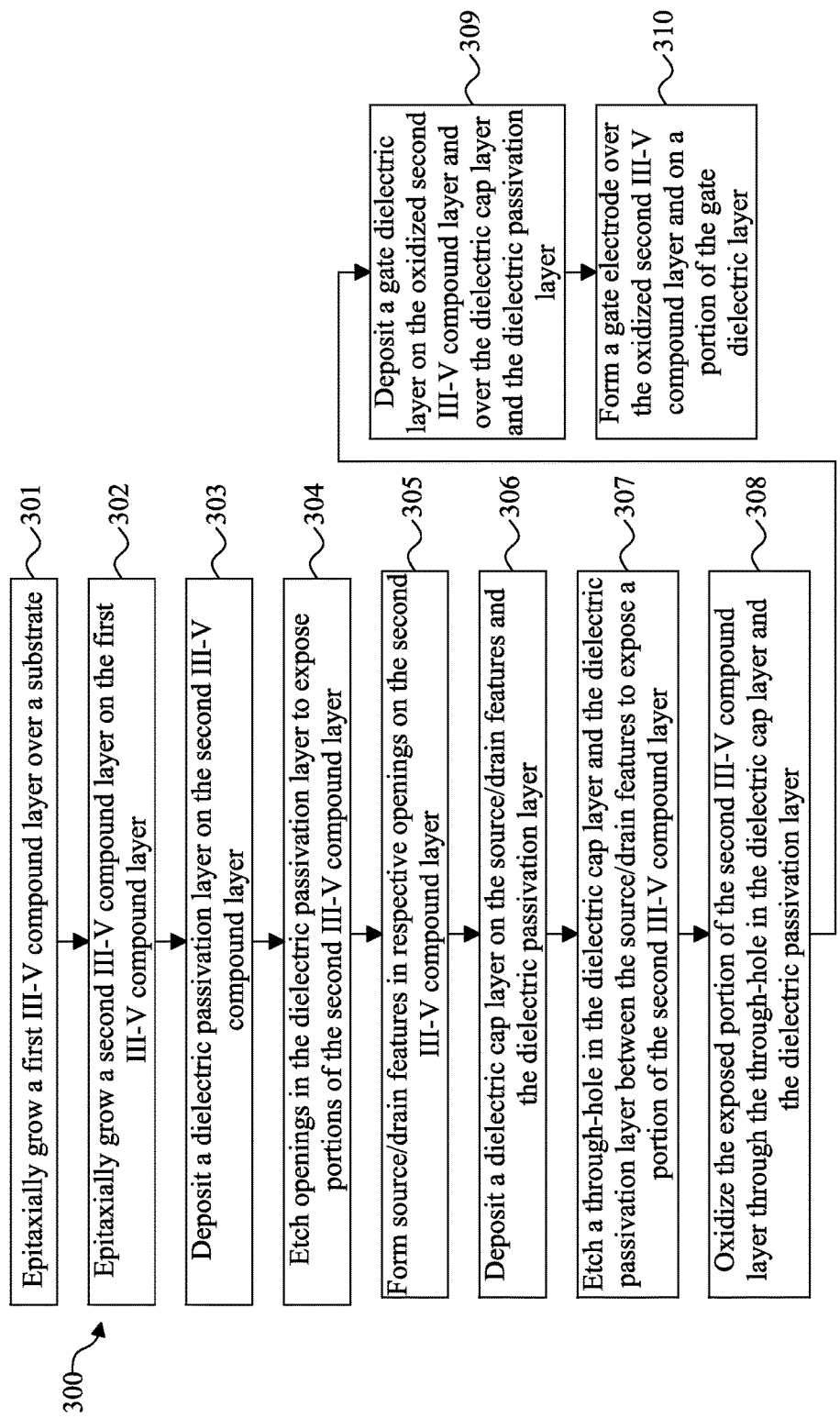
FIG. 3 is a flowchart of a method of forming a semiconductor structure having a HEMT according to certain embodiments of this disclosure.

FIG. 3 is a flowchart of a method 300 of forming a semiconductor structure having a HEMT according to certain embodiments of this disclosure. FIGS. 4A to 4F are cross-sectional views of a semiconductor structure 400 having a HEMT at various stages of manufacture according to various embodiments of the method 300 of FIG. 3. Additional processes may be provided before, during, or after the method 300 of FIG. 3. Some of the structures in FIGS. 4A to 4F may be substantially similar to the embodiments disclosed in FIGS. 2A to 2F and the description of the common structures are not repeated here although fully applicable in the following embodiments as well.

Referring now to FIG. 3, the flowchart of the method 300 begins with operation 301. A first III-V compound layer is epitaxially grown over a substrate. In at least one embodiment, the first III-V compound layer is formed on at least one buffer layer over the substrate. Next, the method 300 continues with operation 302 in which a second III-V compound layer is epitaxially grown on the first III-V compound layer. The second III-V compound layer is different from the first III-V compound layer in composition.

Figure 4C:
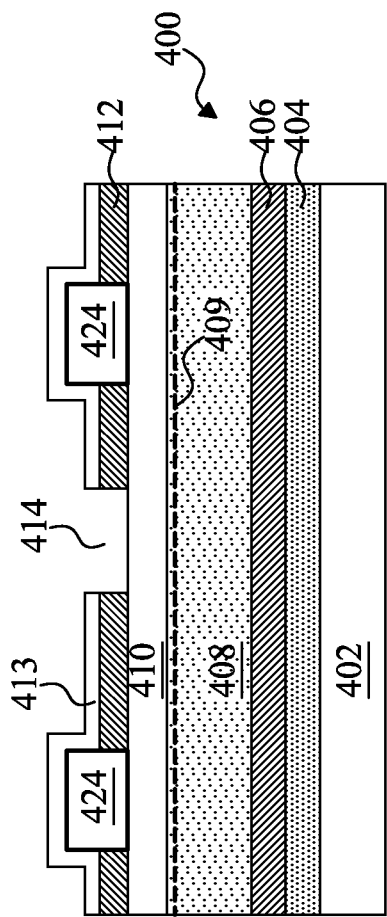

Referring to FIG. 4A, which is an enlarged cross-sectional view of a portion of a substrate 402 of a semiconductor structure 400 after performing operations 301 and 302. At least one buffer layer is formed between the substrate 402 and the later formed first III-V compound layer 408. In the embodiment in FIG. 4A, buffer layers 404 and 406 are formed on the substrate 402 and function as an interface to reduce lattice mismatch between the substrate 402 and the later formed first III-V compound layer 408. A first III-V compound layer 408, also referred to as a channel layer, is grown over the substrate 402 (on the buffer layer 406). A second III-V compound layer 410, also referred to as donor-supply layer, is grown on first III-V compound layer 408. The first III-V compound layer 408 and the second III-V compound layer 410 can be epitaxially grown by metal organic vapor phase epitaxy (MOVPE). An interface 411 is defined between the first III-V compound layer 408 and the second III-V compound layer 410. A carrier channel 409 of 2-DEG is located at the first III-V compound layer 408 near the interface 411. In the embodiment of FIGS. 4A-4F, the second III-V compound layer 410 has a thickness $D_1$ in a range from about 10 nm to about 50 nm. Details of the materials and fabrication methods of the substrate 402, the buffer layers (404 and 406), the first III-V compound layer 408 and the second III-V compound layer 410 can be found in the text associated with the substrate 202, the buffer layers (204 and 206), the first III-V compound layer 208 and the second III-V compound layer 210 in the semiconductor structure 200 and are not repeated here.

Referring back to FIG. 3, method 300 continues with operations 303, 304 and 305. In operation 303, a dielectric passivation layer is deposited on the second III-V compound layer. In operation 304, openings are etched in the dielectric passivation layer to expose portions of the second III-V compound layer. In operation 305, source/drain features are formed in respective openings on the second III-V compound layer.

FIG. 4B illustrates a cross-sectional view of the semiconductor structure 400 after performing operations 303, 304 and 305. A dielectric passivation layer 412 is deposited on a top surface of the second III-V compound layer 410. In some embodiments, the dielectric passivation layer 412 includes silicon oxide or silicon nitride. In at least one example, the dielectric passivation layer 412 is silicon nitride which is formed by performing a low pressure chemical vapor deposition (LPCVD) method without plasma using $SiH_4$ and $NH_3$ gases. Next, openings (not shown) in the dielectric passivation layer 412 are defined by lithography and etching processes to expose portions of the top surface of the second III-V compound layer 410.

A metal layer is deposited over the dielectric passivation layer 412, overfilling the openings and contacting the second III-V compound layer 410. A patterned photoresist layer (not shown) is formed over the metal layer to form a feature over the openings. The metal layer not covered by the feature of the photoresist layer is removed by a reactive ion etch (RIE) process. Metal features 424 are generated after the etching process. The metal features 424 are configured as the source feature or the drain feature in respective openings on the second III-V compound layer 410 for the HEMT. The photoresist layer is removed after the formation of the metal features 424. Details of the materials and fabrication methods of the dielectric passivation layer 412 and the metal features 424 can be found in the text associated with the dielectric passivation layer 212 and the metal features 224 in the semiconductor structure 200 and are not repeated here.

Referring back to FIG. 3, method 300 continues with operations 306 and 307. In operation 306, a dielectric cap layer is deposited on the source/drain features and the dielectric passivation layer. In operation 307, a through-hole is etched in the dielectric cap layer and the dielectric passivation layer to expose a portion of the second III-V compound layer between the source/drain features.

FIG. 4C illustrates a cross-sectional view of the semiconductor structure 400 after performing operations 306 and 307. A dielectric cap layer 413 is deposited on top surfaces of the metal features 424 and the dielectric passivation layer 412. In some embodiments, the dielectric cap layer 413 includes silicon oxide or silicon nitride. The dielectric cap layer 413 may be formed by a plasma enhanced chemical vapor deposition (PECVD) method. The dielectric cap layer 413 covers the source/drain features 424, and prevents the source/drain features 424 from exposure during an annealing process or etching process in later manufacture operations.

Next, a through-hole 414 is formed in the dielectric cap layer 413 and the dielectric passivation layer 412 between the source/drain features 424. A patterned mask layer (not shown) is formed on a top surface of the dielectric cap layer 413 (also over the dielectric passivation layer 412) and an etching process is performed to remove a portion of the dielectric cap layer 413 and the dielectric passivation layer 412. The through-hole 414 exposes a portion of the second III-V compound layer 410 and is configured as a location for the later gate electrode formation.

Referring back to FIG. 3, method 300 continues with operation 308. In operation 308, the exposed portion of the second III-V compound layer through the through-hole in the dielectric cap layer and the dielectric passivation layer is oxidized to form an oxygen containing region. In at least one embodiment, the oxidation is performed in ambient comprising ozone ($O_3$) in a temperature from about 250° C. to about 500° C. In certain embodiments, the oxidation is performed in ambient comprising $H_2O_2$, $H_2O$, $N_2O$ or NO.

Figure 4D:
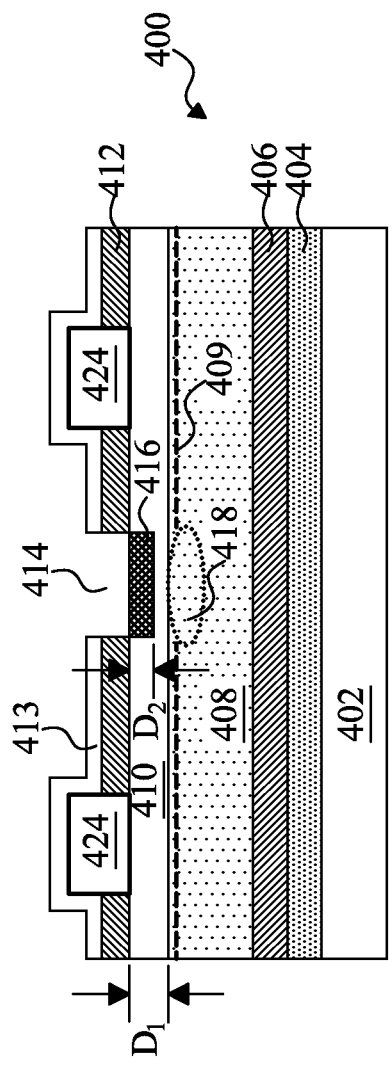

FIG. 4D illustrates a cross-sectional view of the semiconductor structure 400 after performing operation 308. An oxidation process is performed on the exposed portion of the second III-V compound layer 410 to form an oxygen containing region 416 through the through-hole 414. The oxygen containing region 416 comprises a compound including oxygen and at least one composition from the second III-V compound layer. The oxidation consumes the exposed second III-V compound layer 410 (and converts it to the oxygen containing region 416) and generates a full depletion region 418 in the carrier channel 409. The carrier channel 409 becomes normally-off because of the depletion region 418. Details of the materials and fabrication methods of the oxygen containing region 416 can be found in the text associated with the oxygen containing region 216 in the semiconductor structure 200 and are not repeated here.

In at least one embodiment, the oxygen containing region 416 is embedded in the second III-V compound layer 410 under the through-hole 414. In certain embodiments, the oxygen containing region 416 extends further into the first III-V compound layer 408 and is embedded in the second III-V compound layer 410 and a top portion of the first III-V compound layer 408. The oxygen containing region 416 has a thickness $D_2$ in a range from about 5 nm to about 50 nm. In some examples, a ratio of the thickness $D_2$ (of the oxygen containing region 416) to the thickness $D_1$ (of the second III-V compound layer 210) is in a range from about 0.5 to about 1.15. In certain examples, the ratio of the $D_2/D_1$ is in a range from about 0.8 to about 1.15. Out of these ranges, the oxygen containing region 416 may not effectively deplete the electrons in the depletion region 418 of the carrier channel 409, or the HEMT may suffer from low on-current issue.

Referring back to FIG. 3, method 300 continues with operation 309. In operation 309, a gate dielectric layer is deposited on the oxidized second III-V compound layer and on the dielectric cap layer, and over the dielectric passivation layer. In certain embodiments, the steps of oxidizing the exposed portion of the second III-V compound layer in operation 308 and depositing the gate dielectric layer in operation 309 are performed in a same process chamber in different process steps.

Figure 4E:
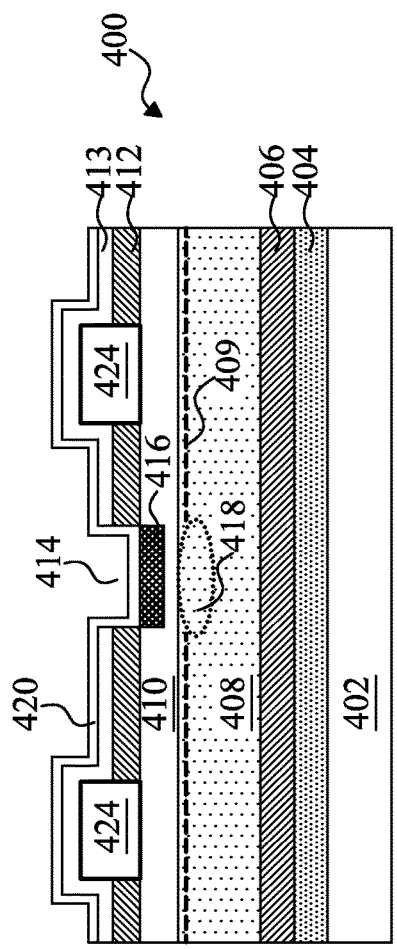

FIG. 4E illustrates a cross-sectional view of the semiconductor structure 400 after performing operation 309. A gate dielectric layer 420 is deposited over the semiconductor structure 400 shown in FIG. 4D. The gate dielectric layer 420 includes a first portion, a second portion and a third portion. The first portion is deposited on the oxidized second III-V compound layer 410 (also the oxygen containing region 416). The second portion is deposited along an interior surface of the through-hole 414. The third portion is deposited on the dielectric cap layer 413. The gate dielectric layer 420 is also deposited over the source/drain features 424. The gate dielectric layer 420 is formed between the oxygen containing region 416 and the later formed gate electrode. The gate dielectric layer 420 may increase the threshold voltage of this HEMT to a higher level and prevent a leakage current from the gate electrode to the second III-V compound layer 410. This HEMT could be operated a higher operation voltage for various applications. Details of the materials and fabrication methods of the gate dielectric layer 420 can be found in the text associated with the gate dielectric layer 220 in the semiconductor structure 200 and are not repeated here.

Referring back to FIG. 3, method 300 continues with operation 310. In operation 310, a gate electrode is formed over the oxidized second III-V compound layer and on a portion of the gate dielectric layer.

Figure 4F:
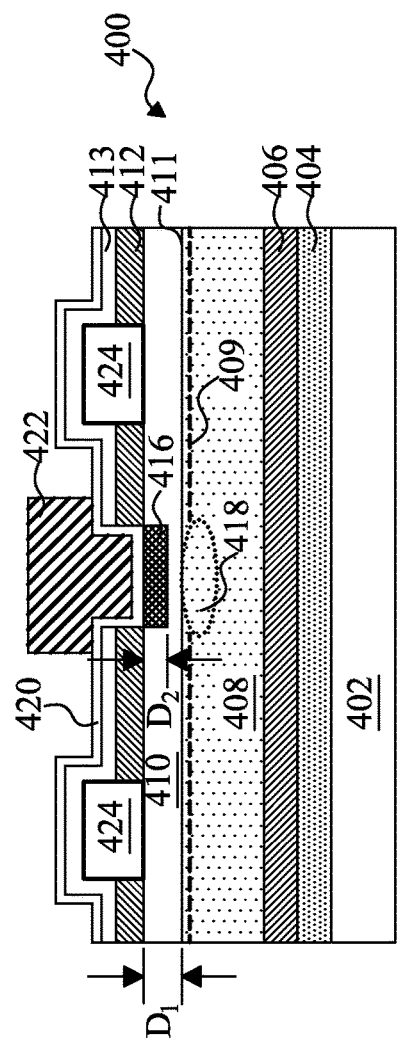

FIG. 4F illustrates a cross-sectional view of the semiconductor structure 400 after performing operation 310. A gate electrode 422 is formed over the oxygen containing region 416 on a portion of the gate dielectric layer 420. The gate electrode 422 is also overlying the depletion region 418 of the carrier channel 409. In at least one example, a gate electrode layer is deposited on the gate dielectric layer 420, and overfills the through-hole 414 shown in FIG. 4E. Lithography and etching processes are performed on the gate electrode layer to define the gate electrode 422. In some embodiments, the gate electrode 422 includes a conductive material layer that includes a refractory metal or its compounds, e.g., titanium (Ti), titanium nitride (TiN), titanium tungsten (TiW) and tungsten (W). In another example, the gate electrode 422 includes nickel (Ni), gold (Au) or copper (Cu). The dielectric cap layer 413 protects the underlying source/drain features 424 from exposure during the etching process to form gate electrode 422.

One aspect of the disclosure describes a semiconductor structure. A second III-V compound layer is disposed on the first III-V compound layer and is different from the first III-V compound layer in composition. A dielectric passivation layer is disposed on the second III-V compound layer. A source feature and a drain feature are disposed on the second III-V compound layer, and extend through the dielectric passivation layer. A gate electrode is disposed over the second III-V compound layer between the source feature and the drain feature. The gate electrode has an exterior surface. An oxygen containing region is embedded at least in the second III-V compound layer under the gate electrode. A gate dielectric layer has a first portion and a second portion. The first portion is under the gate electrode and on the oxygen containing region. The second portion is on a portion of the exterior surface of the gate electrode.

A further aspect of the disclosure describes a semiconductor structure. The semiconductor structure includes at least one III-V compound buffer layer disposed on a silicon substrate. A first III-V compound layer is disposed on the at least one III-V compound buffer layer. A second III-V compound layer is disposed on the first III-V compound layer and is different from the first III-V compound layer in composition. A dielectric passivation layer is disposed on the second III-V compound layer. The dielectric passivation layer has a through-hole exposing a portion of the second III-V compound layer. An oxygen containing region is embedded at least in the exposed portion of the second III-V compound layer under the through-hole. An oxygen containing region is embedded at least in the exposed portion of the second III-V compound layer under the through hole. A gate dielectric layer is disposed on an interior surface of the through-hole and the oxygen containing region, and over at least a portion of the dielectric passivation layer. A gate electrode is disposed on a portion of the gate dielectric layer and over the oxygen containing region. A source feature and a drain feature are disposed on opposite sides of the gate electrode on the second III-V compound layer. The source feature and the drain feature extend through the dielectric passivation layer and contact the second III-V compound layer.

The present disclosure also describes an aspect of a method of forming a semiconductor structure. The method includes epitaxially growing a second III-V compound layer on a first III-V compound layer. A dielectric passivation layer is deposited on the second III-V compound layer. A through-hole is etched in the dielectric passivation layer to expose a portion of the second III-V compound layer. The exposed portion of the second III-V compound layer is oxidized through the through-hole in the dielectric passivation layer. A gate dielectric layer is deposited on the oxidized second III-V compound layer and over the dielectric passivation layer. A gate electrode is formed on a portion of the gate dielectric layer and over the oxidized second III-V compound layer. A source feature and a drain feature are formed on opposite sides of the gate electrode on the second III-V compound layer.

In an embodiment, a method of forming a high electron mobility transistor (HEMT) includes epitaxially growing a first III-V compound layer having a first composition on a substrate and epitaxially growing a second III-V compound layer having a second composition different from the first composition on the first III-V compound layer. A dielectric passivation layer is deposited on the second III-V compound layer, and metal features are formed in the dielectric passivation layer. A dielectric cap layer is deposited on the metal features and the dielectric passivation layer. A through-hole is etched in the dielectric cap layer and the dielectric passivation layer to expose a portion of the second III-V compound layer between the metal features. The exposed portion of the second III-V compound layer is oxidized through the through-hole to form an oxygen containing region, and a gate dielectric layer is deposited on the oxygen containing region and over the dielectric cap layer. A gate electrode is formed on a portion of the gate dielectric layer over the oxygen containing region.

In another embodiment, a method of forming a high electron mobility transistor (HEMT) includes forming a donor-supply layer on a channel layer, wherein a carrier channel is formed at an interface of the donor-supply layer and the channel layer. A dielectric passivation layer is deposited on the donor-supply layer, and an opening is formed in the dielectric passivation layer to expose a portion of the donor-supply layer. The exposed portion of the donor-supply layer is oxidized through the opening to form an oxygen containing region. A gate dielectric layer is deposited on the oxygen containing region and over the dielectric passivation layer, and a gate electrode is formed on a portion of the gate dielectric layer over the oxygen containing region.

Although the embodiments and its advantages have been described in detail, it should be understood that various changes, substitutions and alterations can be made herein without departing from the spirit and scope of the invention as defined by the appended claims. As one of ordinary skill in the art will readily appreciate from the present disclosure, processes, machines, manufacture, compositions of matter, means, methods, or steps that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed:

1. A method of forming a transistor, the method comprising:
    epitaxially growing a second semiconductor layer on a first semiconductor layer;
    forming a dielectric layer on the second semiconductor layer, a first portion of the second semiconductor layer being exposed;
    oxidizing the first portion of the second semiconductor layer, thereby forming an oxidized portion of the second semiconductor layer;
    depositing a gate dielectric layer on the oxidized portion of the second semiconductor layer;
    forming a gate electrode on the gate dielectric layer and over the oxidized portion of the second semiconductor layer;
    forming a dielectric cap layer over the gate electrode and the gate dielectric layer; and
    after forming the gate electrode, forming a source feature and a drain feature on the second semiconductor layer, the source feature and the drain feature extending through the dielectric layer to the second semiconductor layer, wherein the source feature and the drain feature extends through the dielectric cap layer.

2. The method of claim 1, wherein the first semiconductor layer is a first III-V compound.

3. The method of claim 2, wherein the second semiconductor layer is a second III-V compound.

4. The method of claim 1, wherein the gate dielectric layer extends over the dielectric layer.

5. The method of claim 1, wherein the source feature and the drain feature directly contacts a vertical edge of the dielectric cap layer.

6. The method of claim 1, wherein the source feature and the drain feature extends above the dielectric cap layer.

7. The method of claim 1, wherein the gate dielectric layer extends along opposing sidewalls of the source feature and the drain feature along a source-to-drain direction.

8. A method of forming a transistor, the method comprising:
    epitaxially growing a first semiconductor layer having a first composition on a substrate;
    epitaxially growing a second semiconductor layer having a second composition different from the first composition on the first semiconductor layer;

depositing a dielectric layer on the second semiconductor layer;

after depositing the dielectric layer, forming a source region and a drain region, the source region and the drain region extending through the dielectric layer;

after forming the source region and the drain region, forming a dielectric cap layer over the dielectric layer, wherein the dielectric cap layer extends over the source region and the drain region;

forming an opening in the dielectric layer to expose a first portion of the second semiconductor layer between the source region and the drain region;

oxidizing the first portion of the second semiconductor layer to form an oxygen containing region;

after forming the dielectric cap layer, depositing a gate dielectric layer on the oxygen containing region; and forming a gate electrode on the gate dielectric layer over the oxygen containing region.

9. The method of claim 8, wherein the gate dielectric layer extends over the source region and the drain region.

10. The method of claim 8, wherein a thickness of the oxygen containing region is in a range from about 5 nm to about 50 nm.

11. The method of claim 10, wherein a thickness of the second semiconductor layer is in a range from about 10 nm to about 50 nm.

12. The method of claim 11, wherein a ratio of a thickness of the oxygen containing region to a thickness of the second semiconductor layer is in a range from about 0.5 to about 1.15.

13. The method of claim 8, wherein oxidizing the first portion of the second semiconductor layer is performed in an ambient comprising ozone in a temperature from about 250° C. to about 500° C.

14. The method of claim 8, wherein the gate electrode extends over the dielectric cap layer.

15. A method of forming a transistor, the method comprising:

forming a first semiconductor layer having a first composition on a substrate;

forming a second semiconductor layer on the first semiconductor layer, the second semiconductor layer having a second composition different from the first composition;

forming a first dielectric layer on the second semiconductor layer;

after forming the first dielectric layer, forming a source region and a drain region, the source region and the drain region extending through the first dielectric layer;

after forming the source region and the drain region, forming a second dielectric layer over the source region and the drain region;

forming an opening through the first dielectric layer and the second dielectric layer to expose an upper surface of a first portion of the second semiconductor layer between the source region and the drain region;

oxidizing the first portion of the second semiconductor layer to form an oxygen containing region;

depositing a gate dielectric layer on the oxygen containing region, wherein the gate dielectric layer extends to the source region and the drain region; and forming a gate electrode on the gate dielectric layer over the oxygen containing region.

16. The method of claim 15, wherein a thickness of the source region is greater than a thickness of the first dielectric layer.

17. The method of claim 15, wherein forming the source region and the drain region comprises:

etching a first opening and a second opening in the first dielectric layer;

forming a metal layer over the first dielectric layer, the metal layer overfilling the first opening and the second opening; and patterning the metal layer to form the source region and the drain region.

18. The method of claim 17, wherein the gate dielectric layer extends along opposing sidewalls of the source region and along opposing sidewalls of the drain region.

19. The method of claim 15, wherein unoxidized portions of the second semiconductor layer extends under the oxygen containing region.

20. The method of claim 15, wherein the second dielectric layer extends along sidewalls of the source region and the drain region.

* * * * *